United States Patent
Sareen et al.

(10) Patent No.: US 7,737,791 B2
(45) Date of Patent: Jun. 15, 2010

(54) SPREAD SPECTRUM CLOCKING IN FRACTIONAL-N PLL

(75) Inventors: Puneet Sareen, Freising (DE);
Hermann Seibold, Haag (DE)

(73) Assignee: Texas Instruments Deutschland GmbH, Freising (DE)

(*) Notice: Subject to any disclaimer, the term of this patent is extended or adjusted under 35 U.S.C. 154(b) by 111 days.

(21) Appl. No.: 12/205,586

(22) Filed: Sep. 5, 2008

(65) Prior Publication Data
US 2009/0066423 A1    Mar. 12, 2009

Related U.S. Application Data

(60) Provisional application No. 61/016,900, filed on Dec. 27, 2007.

(30) Foreign Application Priority Data

Sep. 5, 2007    (DE) .................. 10 2007 042 070

(51) Int. Cl.
*H03L 7/08* (2006.01)
*H03L 7/16* (2006.01)

(52) U.S. Cl. ......................... 331/1 A; 331/16

(58) Field of Classification Search .................. 331/1 A, 331/8, 16–18, 25, 45, 57
See application file for complete search history.

(56) References Cited

U.S. PATENT DOCUMENTS

| 7,043,202 | B2 | 5/2006 | Ozawa et al. | |
|---|---|---|---|---|
| 7,123,101 | B2 * | 10/2006 | Puma et al. | ............... 331/16 |
| 2005/0040893 | A1 | 2/2005 | Paist et al. | |
| 2005/0242851 | A1 | 11/2005 | Booth et al. | |
| 2007/0041486 | A1 | 2/2007 | Shin | |

FOREIGN PATENT DOCUMENTS

DE    102005050828 A1    7/2006

* cited by examiner

*Primary Examiner*—David Mis
(74) *Attorney, Agent, or Firm*—John J. Patti; Wade J. Brady, III; Frederick J. Telecky, Jr.

(57) ABSTRACT

In applications that use fractional-N phase locked loops (PLLs), the use of spread spectrum clocking (SSC) to reduced electromagnetic interference (EMI) would be desirable, but conflicts can occur. Here, a circuit is provided that includes both fractional logic circuitry and spread spectrum logic circuitry. This logic circuitry operates in combination with a phase selector to generally ensure that the likelihood of conflicts (which can occur in conventional circuit) are reduced.

6 Claims, 6 Drawing Sheets

SPREAD SPECTRUM CLOCKING IN FRACTIONAL-N PLL

This patent application claims priority from German Patent Application No. 10 2007 042 070.8, filed 5 Sep. 2007, and from U.S. Provisional Patent Application No. 61/016,900, filed 27 Dec. 2007, the entireties of which are incorporated herein by reference.

FIELD OF THE INVENTION

The invention relates to a spread spectrum, fractional, phase locked loop circuit that can be used as a frequency synthesizer.

BACKGROUND

Electromagnetic interference (EMI) originating from high frequency applications is a problem that increases with the multiplication of wireless services and devices. Shielding is the conventional approach to counteract EMI; however, it requires considerable investment on the hardware side. A different approach is spread spectrum clocking (SSC) that can be used in digital circuits, especially when the operating frequency required by a particular application is generated with a phase locked loop (PLL) circuit. With SSC, a center frequency is modulated in accordance with an appropriate pattern so that the average frequency over time is still the center frequency. In the PLL, a change of frequency can be obtained by adding discrete phase steps to the feedback signal in one or the other of two opposed directions. For example, in a "down spread" the phase of the feedback signal is rotated in an anti-clockwise direction, for "up spread" the phase is rotated in a clockwise direction, and for "center spread" the phase is rotated once in a clockwise and then in an anti-clockwise direction (with reference to a 360° phase diagram of the feedback signal). To add phase steps to the feedback signal in one or the other of the two opposite directions, a phase selector can be used if the oscillator used in the PLL has multiple phase outputs (such as in a ring oscillator, for example). When small phase steps are required, a phase interpolator can be used in conjunction with the phase selector to divide the phase gaps between adjacent phases of the multiple oscillator outputs. Some logic circuitry is provided to control the phase selector and the phase interpolator in accordance with a desired frequency pattern.

A PLL circuit can be used as a frequency synthesizer to generate from an input reference frequency an output frequency determined by the ratio of the dividends used in the input divider and in the feedback divider. When a frequency needed for a particular application cannot be achieved with fixed dividends in the input and feedback dividers, a "fractional-N phase locked loop" is needed. A fractional-N PLL can generate a fractional frequency from a reference frequency. In addition to the conventional input and feedback dividers of the PLL, the feedback loop includes a phase selector or phase aligner capable of adding discrete phase steps to the feedback signal in one or the other of opposite directions. The phase selector is controlled by logic circuitry so that the required number of phase steps is added to the feedback signal in one or the other direction for the desired output frequency of the PLL.

In an application that needs a fractional-N PLL, it would be a major advantage if SSC could be used to reduce the EMI. A possible approach is to interface SSC circuitry with the fractional-N PLL. However, since both approaches, fractional-N and SSC, use the concept of adding phase steps to the feedback signal, conflicting situations can occur. A first situation is when the fractional-N logic and the SSC logic both request a phase step at the same time and in the same direction. In that case, two phase steps are needed, but if both phase steps are made at the same time, the feedback divider experiences a huge phase step and can fail. In addition, a phase shifting circuit is needed that can handle both phase steps at the same time, which is more difficult to achieve. A second situation is when the fractional-N logic and the SSC logic both request a phase step at the same time but in the opposite directions. In such a case, no phase step at all can be needed.

SUMMARY

It is an object of the invention to provide a fractional-N phase locked loop circuit in which SSC logic can be used to counteract EMI.

The invention provides a combined spread spectrum and fractional-N phase locked loop circuit that resolves possible conflicts between the phase requests from the spread spectrum logic and the fractional-N logic. Specifically, the invention provides a chain of a reference clock divider, a phase-frequency detector, a charge pump with loop filter, a voltage controlled oscillator that provides multiple phase outputs, and a feedback loop from the multiple phase outputs of the voltage controlled oscillator to a feedback input of the phase-frequency detector. The feedback loop includes a phase selector, a feedback divider and a control block with an output controlling said phase selector to select a particular phase as an input to the feedback divider. The control block includes spread spectrum logic circuitry receiving an input from the output of the phase selector and providing a directional control output signal and a phase step control signal. The control block further includes fractional logic circuitry receiving an input from the output of the phase selector and providing a phase step control signal. A logic interface circuit combines the directional control output signal from the spread spectrum logic circuitry, the phase step control signal from the spread spectrum logic circuitry, and the phase step control signal from the fractional logic circuitry. This means that when both of the spread spectrum logic circuitry and the fractional logic circuitry request a phase step in the same feedback clock period in the same direction, a single phase step control signal is passed to the phase selector and a further phase step control signal is passed to the phase selector in a subsequent clock period. Further, when the spread spectrum logic circuitry and the fractional logic circuitry request a phase step in the same feedback clock period in opposite directions, no phase step control signal is passed to the phase selector.

The phase locked loop circuit according to a described embodiment of the invention comprises a phase frequency detector, charge pump and loop filter, and a voltage controlled oscillator, as well as a reference clock divider, as in a conventional phase locked loop. The voltage controlled oscillator is operable to provide multiple phase outputs and these multiple phase outputs are fed back to the input of the phase locked loop at the feedback input of the phase frequency detector. In the feedback loop, between the outputs of the voltage controlled oscillator and the feedback input of the phase frequency detector, a phase selector, a feedback divider and a control block are provided. The output of the control block is operable to control the phase selector so that it selects a certain phase from the multiple phase output of the voltage controlled oscillator and inputs that phase to the feedback divider. The control block can include spread spectrum logic circuitry, which outputs a directional control signal and a phase step control signal. The spread spectrum logic circuitry works by accelerating or decelerating the rate of change of phases in the feedback path. When this phase change is integrated with a phase locked loop, a change in frequency is obtained, which can be used to counteract EMI. In other words, the center frequency of the output of the PLL is modulated in accordance with an appropriate pattern so that the average frequency over time remains at the center frequency. The control block can further include fractional logic circuitry and a logic interface circuit. The fractional logic circuitry receives the output of the phase selector at its input and then outputs a phase step control signal. The logic interface circuit is operable to combine the directional control output signal and the phase step control signal from the spread spectrum logic circuitry, along with the phase step control signal from the fractional logic circuitry. In this way, when a phase step is requested in the same feedback clock period, and in the same direction, by both the spread spectrum logic circuitry and the fractional logic circuitry, a single phase step control signal is fed to the phase selector by the logic interface circuit in that clock period. A further phase step control signal is passed to the phase selector from the logic interface circuit in a subsequent clock period. However, when a phase step is requested in the same feedback clock period but in opposite directions by both the spread spectrum logic circuitry and the fractional logic circuitry, the logic interface circuit does not pass a phase step control signal to the phase selector. Accordingly, when the fractional-N logic and the SSC logic both request a phase step at the same time and in the same direction, the logic interface circuit ensures that a huge phase step is avoided by performing two phase steps in immediately successive cycles. When the fractional-N logic and the SSC logic both request a phase step at the same time but in the opposite directions, no phase step at all occurs, since no phase shift at all is required in this case. In this way, EMI in the fractional-N phase locked loop circuit is counteracted without the need for the considerable hardware investment of electromagnetic shielding. Dependent on the specific architecture of the logic interface circuitry, two requests can be considered to occur at the same time if they arrive at the phase selector at the same time rather than being issued at the same.

Preferably, the phase selector includes a phase interpolator, which receives an output from the voltage controlled oscillator. The output of the interpolator is then applied to the fractional logic circuitry and also to the logic interface circuit. The logic interface circuit can then control the interpolator to select a particular phase from the multiple phase outputs of the voltage controlled oscillator, based on the outputs of the spread spectrum logic circuitry and fractional-N logic derived from the interpolator.

In example embodiments, the logic interface circuit can include two shift registers clocked by the output of the phase selector. A first one of the shift registers has inputs for receiving the directional control output signal from the spread spectrum logic circuitry, the phase step control signal from the spread spectrum logic circuitry and the phase step control signal from the fractional logic circuitry. A second one of the shift registers has inputs for receiving the directional control output signal from the spread spectrum logic circuitry and the phase step control signal from the spread spectrum logic circuitry. The outputs of the shift registers are combined with an OR gate to provide a phase step control signal to the phase selector. One shift register receives three inputs; the directional control signal and the phase step control signal output from the spread spectrum logic circuitry, as well as the phase step control signal from the fractional logic circuitry. The other shift register receives two inputs; the directional control output signal and the phase step control signal, both from the spread spectrum logic circuitry. Both shift registers receive the same clock signal at their clock inputs, which is the output of the phase selector. An OR gate is then operable to combine the outputs of both shift registers, with the output of the OR gate being fed to the phase selector. This output indicates to the phase selector by how much it should shift the phase of the output signal. Preferably, the second shift register provides a direction control signal to the phase selector, which indicates to the phase selector the direction in which the phase should be shifted (clockwise, anti-clockwise or not at all).

BRIEF DESCRIPTION OF THE DRAWINGS

Further features and advantages of the invention will be apparent from the following description of preferred embodiments, with reference to the accompanying drawings, wherein.

DETAILED DESCRIPTION OF EXAMPLE EMBODIMENTS

Figure 1:
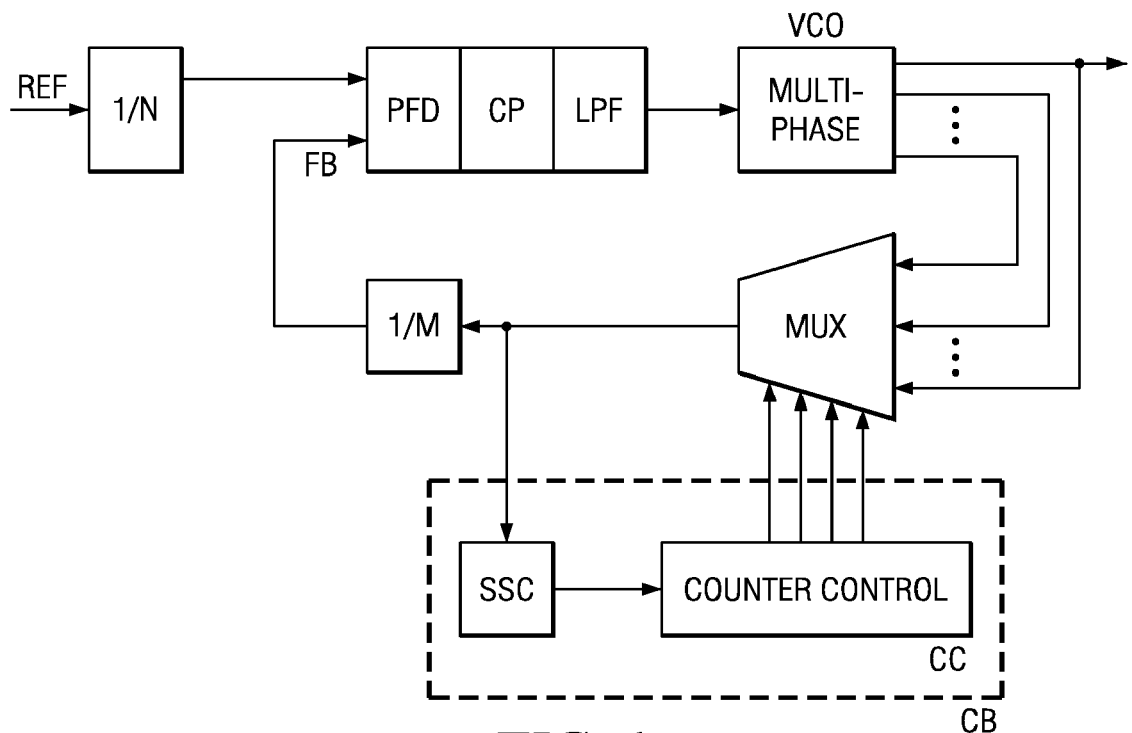
FIG. 1 is a simplified schematic of a conventional phase locked loop employing

FIG. 1 shows a conventional spread spectrum logic phase locked loop, with a phase frequency detector operable to receive inputs from a reference clock divider 1/N and a feedback divider 1/M. An input reference clock signal REF and a feedback clock signal FB are fed to a phase frequency detector PFD. The output of the phase frequency detector is connected to the input of a charge pump CP, with the output of the charge pump being connected to the input of a voltage controlled oscillator VCO via a loop filter LPF. The voltage controlled oscillator VCO is operable to provide multi-phase outputs, one of which is selected as an output frequency, and all of which are connected to a multiplexer MUX. The output of the multiplexer MUX is connected to the feedback divider 1/M and also to the input of a control block CB. The control block CB is formed of a spread spectrum logic stage SSC with an input connected to the output of the multiplexer MUX and an output connected to a counter control stage CC. The output of the counter control stage CC is connected to a control input of the multiplexer MUX.

One of the phases output from the voltage controlled oscillator VCO is taken as the output clock of a synthesizer. The multiple output phases of the voltage controlled oscillator VCO are then fed to the inputs of the multiplexer MUX, with the output signal from the multiplexer MUX being fed back in a feedback loop to the feedback input of the phase frequency detector PFD via the feedback divider 1/M. The output signal from the multiplexer MUX is also fed to the spread spectrum logic stage SSC. If the rate of change of phases in the feedback loop is accelerated or decelerated, and this phase change is integrated in the phase locked loop, a change in frequency is obtained. The architecture and functionality of the spread spectrum stage SSC depends on the acceleration or deceleration profile. For down spread of the frequency, the phases are rotated in an anti-clockwise direction and for up spread, the phases are rotated in a clockwise direction. To generate center spread, the phases are rotated once in a clockwise direction, then once in an anti-clockwise direction.

Figure 2:
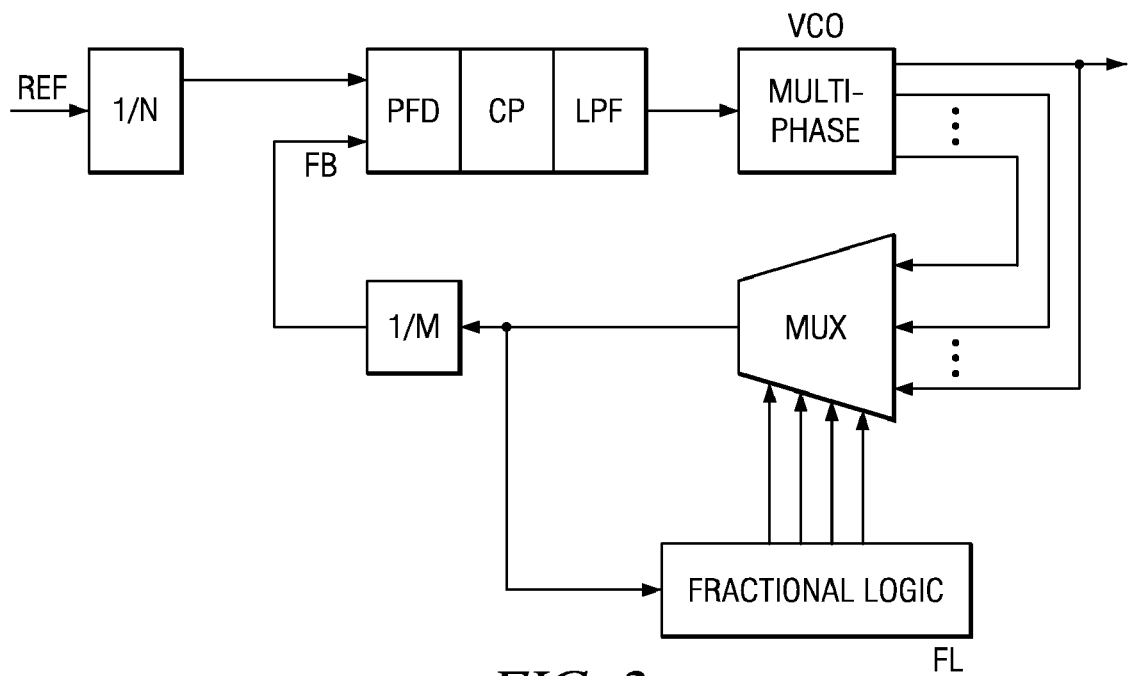
FIG. 2 is a simplified schematic of a phased locked loop employing fractional N logic.

FIG. 2 shows a conventional fractional N phase locked loop circuit. The phase locked loop circuit is almost exactly the same as the circuit shown in FIG. 1, except that a fractional logic stage FL is provided in place of the control block CB so that the output of the multiplexer MUX is connected to the input of the fractional logic stage FL and the output of the fractional logic stage FL is connected to the control input of the multiplexer MUX.

The operation of this phase locked loop circuit is also based on phase shifting in the feedback path, except that the phase shifting is now requested by the fractional logic stage FL instead of the spread spectrum logic stage SSC. However, if the spread spectrum logic stage SSC and the fractional logic stage are combined, the following conflicts arise. First of all, the spread spectrum logic and fractional N logic can send a phase change request at the same time and in the same direction. In this situation, effectively two phases are required to be shifted at the same time. If a circuit is implemented to shift two phases at the same time the feedback divider 1/M will see a huge phase jump and can fail and furthermore the phase shifting circuit will be complicated. Secondly, a conflict can arise if the spread spectrum logic SSC and fractional N logic send a phase shift request at the same time but in opposite directions. Effectively, no phase is required to be shifted at all in this case.

Figure 3:
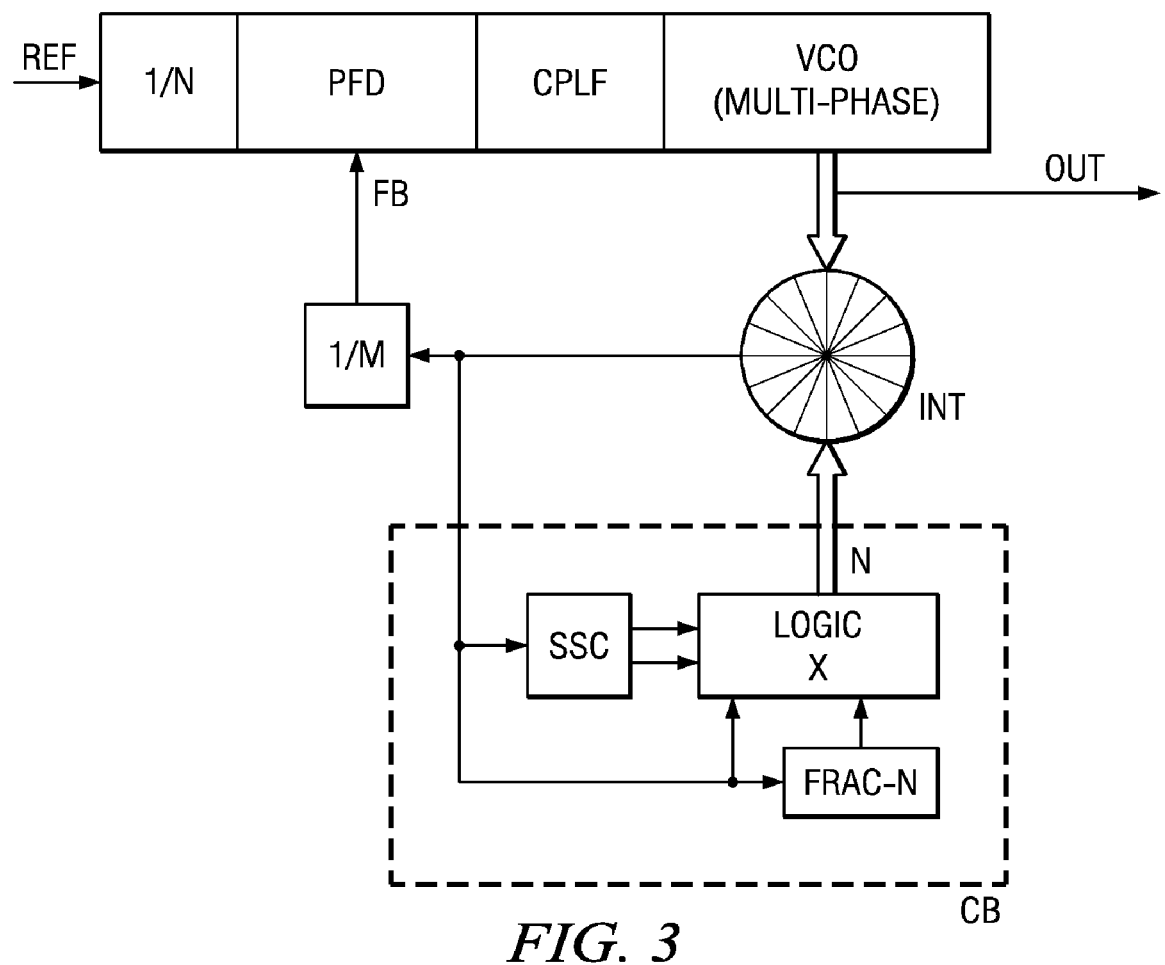
FIG. 3 is a simplified schematic of a phase locked loop according to the invention.

FIG. 3 shows a phase locked loop according to the invention in which the problems of interfacing spread spectrum logic and fractional N logic are overcome. A reference clock divider 1/N is provided at the input of a phase frequency detector PFD and is operable to receive a reference clock signal Ref. The output of the phase frequency detector is connected to a charge pump and loop filter stage CPLF, the output of which is coupled to a voltage controlled oscillator VCO. The voltage controlled oscillator VCO is operable to provide multiple phase outputs, which are input to an interpolator INT. The interpolator INT acts as a phase selector and could also be implemented, for example, as a multiplexer. One of the multiphase outputs of the voltage controlled oscillator VCO is selected as a synthesized frequency output.

The interpolator INT is provided in the feedback loop of the phase locked loop so that its output is connected to a feedback divider 1/M, with the output of the feedback divider 1/M being fed to the feedback input of the phase frequency detector PFD. In addition, the output of the interpolator INT is connected to the inputs of a spread spectrum logic stage SSC, a fractional logic stage Frac-N and a logic interface circuit LOGIC X. The spread spectrum logic stage SSC, the fractional logic stage Frac-N and the logic interface circuit LOGIC X form a control block CB for controlling the interpolator INT to select a particular phase from the multiple phase output of the voltage controlled oscillator VCO. The spread spectrum logic stage SSC is operable to provide two outputs to the logic interface circuit LOGIC X; a directional control output and a phase step control output. The fractional logic circuitry Frac-N is operable to provide a phase step control output to the logic interface circuit LOGIC X. The logic interface circuit LOGIC X then provides an input to the interpolator INT based on the outputs it receives from the spread spectrum logic stage SSC and the fractional logic circuitry Frac-N.

The spread spectrum logic stage SSC and the fractional logic stage Frac-N both receive the output from the interpolator INT selected from the multiple phase outputs of the voltage controlled oscillator VCO. It is then determined in both, the spread spectrum logic stage SSC and the fractional logic circuitry Frac-N how the interpolator INT is to be controlled in order to generate the correct next clock phase. If it is required to modulate the output frequency, the spread spectrum logic stage SSC indicates in which direction the phase of the feedback signal should be rotated using the directional control output. In this example, if it is required to reduce the frequency "down spread", the phase of the feedback signal is rotated in an anti-clockwise direction and if it is required to increase the frequency "up spread", the phase is rotated in a clockwise direction, however, it can be the opposite way around. Phase rotation of the signal is controlled by the directional control output signal output from the spread spectrum logic stage SSC. The spread spectrum logic stage SSC and the fractional logic stage Frac-N can then both indicate that discrete phase steps should be added to the feedback signal, with the phase step control signals provided at their outputs. When both the spread spectrum logic stage SSC and the fractional logic stage Frac-N request a phase step in the same feedback clock period, in the same direction, a single phase step control control signal is passed from the logic interface circuit LOGIC X to the interpolator INT, followed by a further phase step control signal in the subsequent clock period. The interpolator INT then adjusts the phase of the feedback signal accordingly, so as to modulate its center frequency to the required output frequency. However, if the spread spectrum logic stage SSC and the fractional logic stage Frac-N request a phase step in the same feedback clock period, but in opposite directions, the logic interface circuit LOGIC X does not pass a phase step control signal to the interpolator INT.

Figure 4:
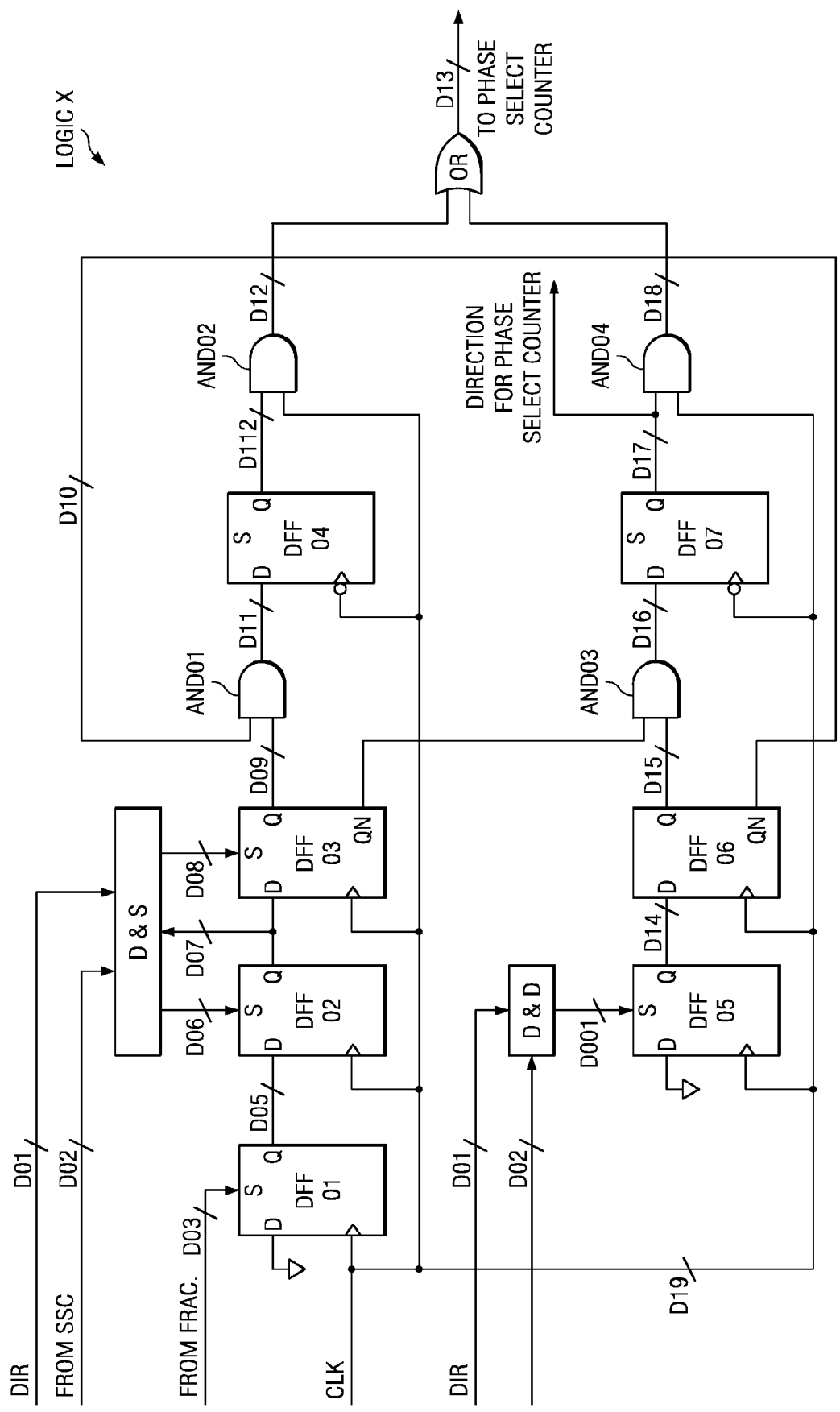
FIG. 4 is a simplified circuit diagram of a logic interface circuit for a phase locked loop according to the invention.
Figure 5A:
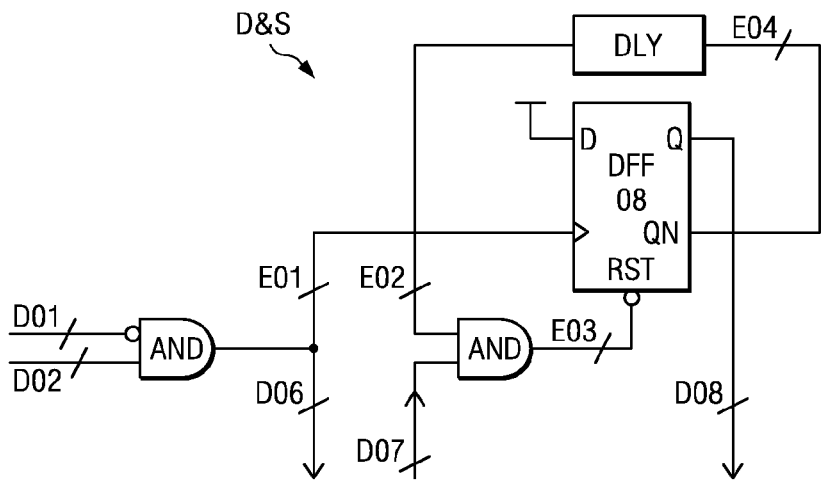
FIGS. 5A and 5B are simplified circuit diagrams of circuit blocks from a logic interface circuit for a phase locked loop according to the invention.
Figure 5B:
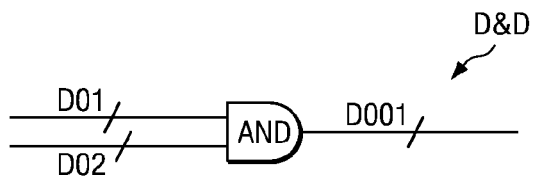
Figure 6:
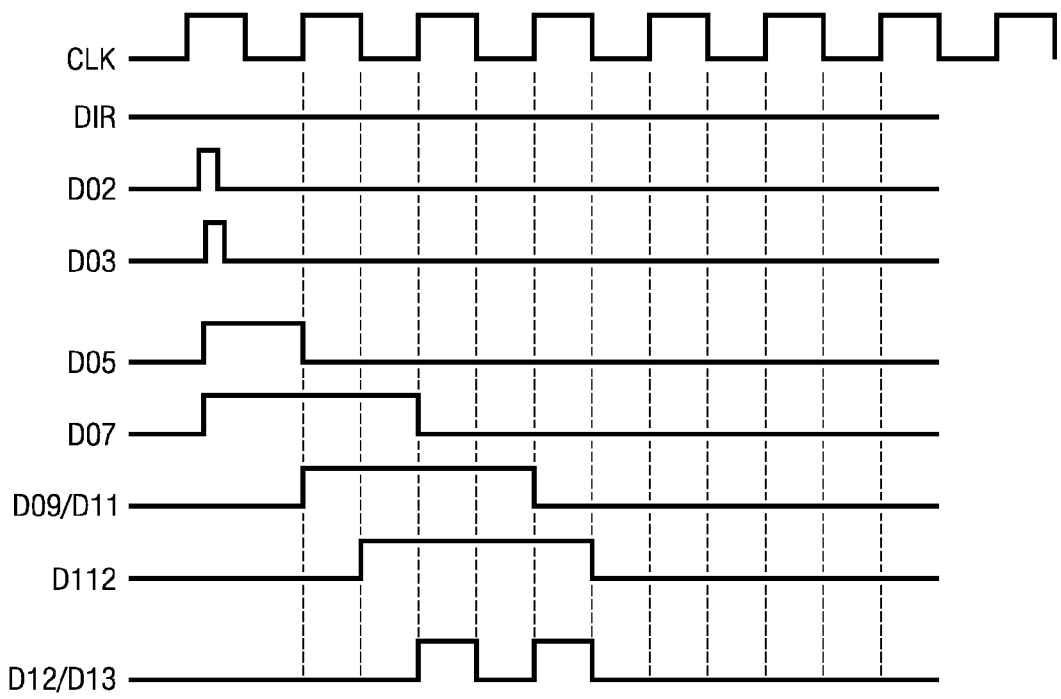
FIG. 6 shows a first example of a timing diagram for a logic interface circuit in a phase locked loop according to the invention.
Figure 7:
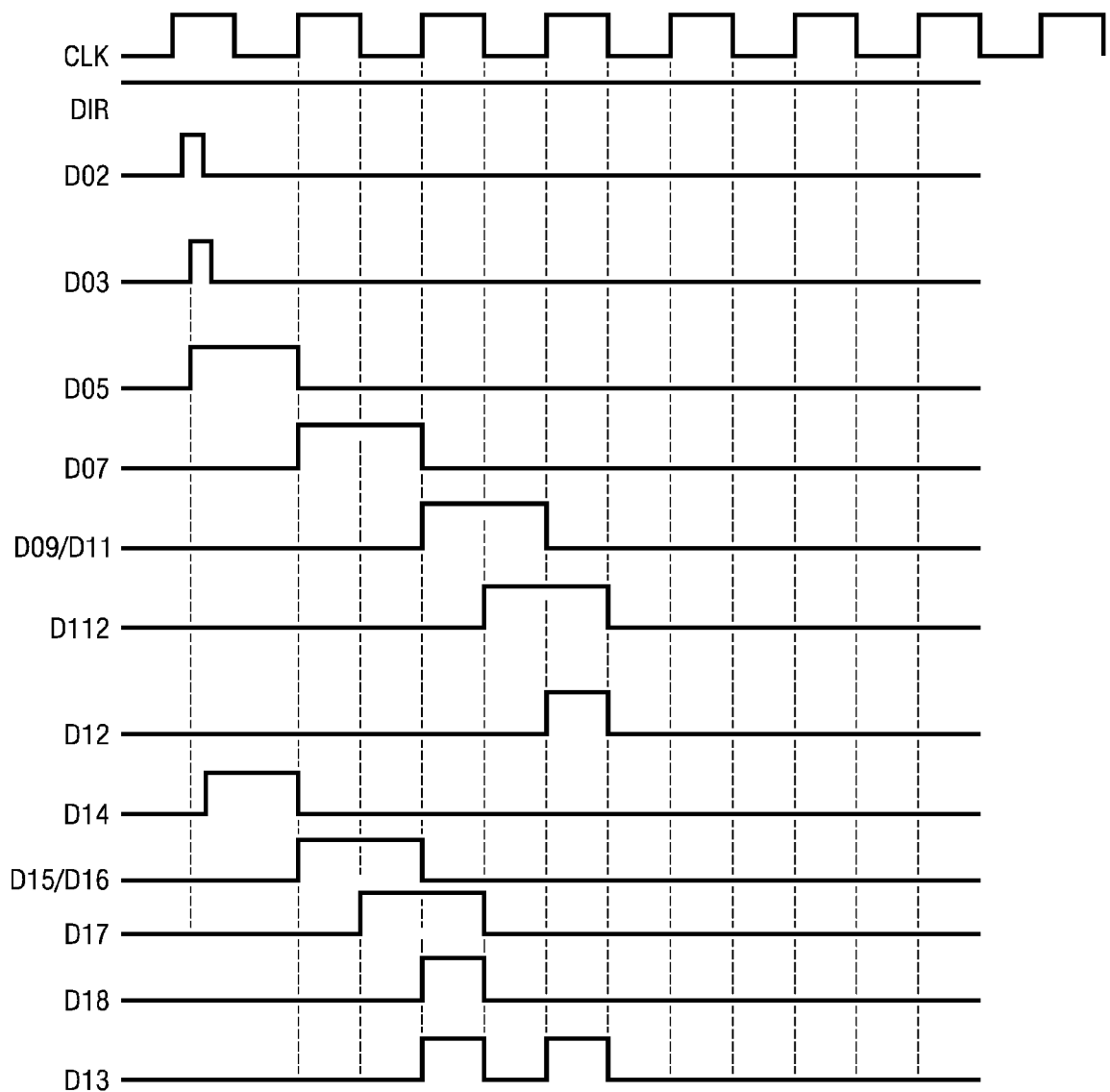
FIG. 7 shows a second example of a timing diagram for a logic interface circuit in a phase locked loop according to the invention.
Figure 8:
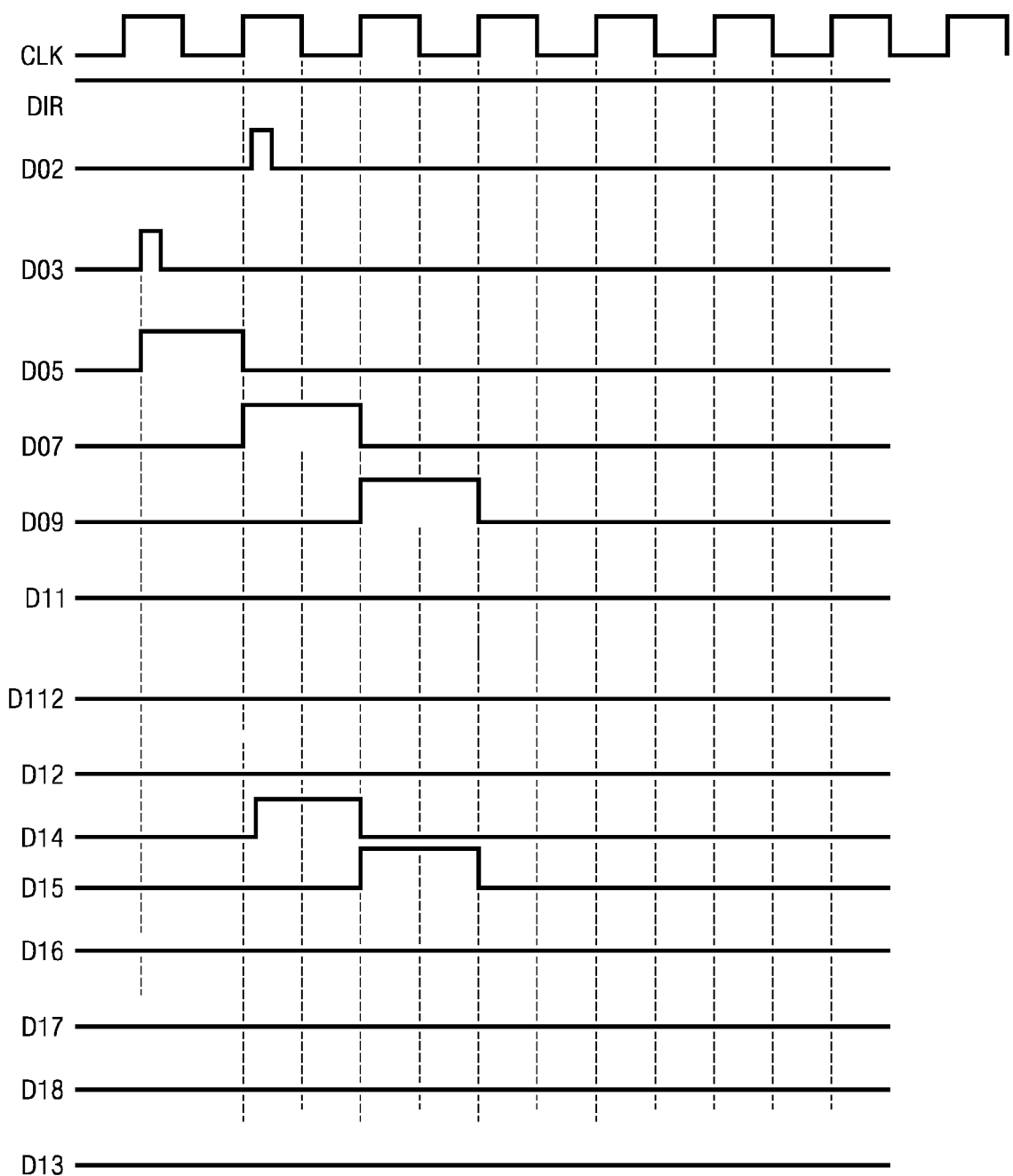
FIG. 8 shows a third example of a timing diagram for a logic interface circuit in a phase locked loop according to the invention.

The logic interface circuit LOGIC X is shown in more detail in FIGS. 4 and 5, with FIGS. 6 to 8 showing timing diagrams at various stages of the logic interface circuit LOGIC X. The logic interface circuit LOGIC X comprises two shift registers each consisting of three flip-flops DFF. The first shift register has a detect and set stage D&S at the set inputs of two DFFs, which is shown in detail in FIG. 5A, and is operable to receive two inputs D01 and D02 from the spread spectrum logic stage—the directional control signal (DIR, or D01) and the phase step control signal (D02), respectively. The second shift register has a direction detect stage D&D at its input, which is shown in detail in FIG. 5B. The direction detect stage D&D is also operable to receive the direction control signal and phase step control signal inputs D01 and D02 from the spread spectrum logic stage.

The operation of the logic interface circuit LOGIC X will now be described with reference to FIGS. 4, 5A and 5B and with reference to the timing diagrams in FIGS. 6 to 8. As could be seen in FIGS. 5A and 5B, when the input D01 is low, the detect and set stage D&S is activated and the direction detect stage D&D is not activated. Now when the input D01 is at low and a rising edge arrives at D02, this results in a rising edge at D06. If during this rising edge D07 is in a low state, D08 will stay low as the flip flop DFF08 will stay reset. If, however, D07 is high during a rising edge at E01, D08 will be set for a delay DLY and then it will be reset again. This means that a rising edge will be generated at D08. Now if D01 is high then nothing will happen in the detect and set stage D&S during the rising edge at D02. However, in the direction detect stage D&D, the rising edge will be passed to D01 as shown in FIG. 5B.

As could be seen in FIG. 4, the first shift register includes flip-flops DFF01, DFF02, DFF03, DFF04, gates AND01 and AND02, as well as the detect and set stage D&S. This shift register works for the case when both the spread spectrum logic stage and the fractional N logic stage try to rotate the phase in the same direction, for example the clockwise direction. The second shift register includes flip-flops DFF05, DFF06 and DFF07, gates AND03 and AND04, as well as the direction detect stage D&D. In this case it is assumed that when the input D01 (=DIR) is at logic 0, then the phase should be rotated in the clockwise direction and when it is at logic 1, then the phase should be rotated in the anti-clockwise direction. However, this is not a limitation of the circuit and the phase could also be rotated anti-clockwise for logic 0 and clockwise for logic 1. The first shift register also receives a phase step control signal D03 from the output of the fractional N stage Frac-N. The signal D02 activates phase shift, the signal D01 determines the direction of the phase shift and the signal D03 initiates the phase change. When the signal D03 is received at the set input of the flip-flop DFF01 in the first shift register, the flip-flop DFF01 is set and when the signal D02 is received at the direction detect circuit D&D, the direction detect circuit D&D is activated. If the signal D01 is at logic low, then the detect and set circuit D&S detects it. At the same time, it monitors the signal D07 output from the flip-flop DFF02 in the first shift register. If D07 is at logic 0, then the detect and set circuit D&S will set the flip-flop DFF02 and if D07 is at logic 1, then the detect and set circuit D&S will set the next flip-flop in the serial shift register DFF03. In this case, the direction detect circuit D&D will not be activated. This removes the conflict when both the spread spectrum logic stage and the fractional-N stage try to shift the phase simultaneously and in the same direction. When the phase step control signal D02 arrives at the direction detect circuit D&D and the signal D01 is at logic 1, the direction detect circuit D&D detects the signal D02 and sets the flip flop DFF05 in the second shift register. The detect and set circuit D&S will not be activated in this case. At every clock cycle, the flip-flop contents gets shifted in the first shift register (DFF01; DFF02; DFF03) or in the second shift register (DFF05; DFF06). If the signal D09 output from the flip-flop DFF03 in the first shift register is at logic high and the signal D15 output from the flip-flop DFF06 in the second shift register is also at logic high, then at the next clock edge, the flip-flop DFF04 in the first shift register and the flip-flop DFF07 in the second shift register will sample logic 0 at the negative edge of the clock and the output of the logic stage LOGIC X (therefore the input to the interpolator INT) will be at logic 0. This indicates that when there is a clockwise shift and an anti-clockwise shift at the same time, there will not be any phase shift at all.

Accordingly, the LOGIC X stage serves to serialize two phase shift requests, which occur at the same time at the input of the LOGIC X stage. If the fractional N stage Frac-N requests a phase shift, the request is shifted through the shift register. After three clock cycles, the corresponding phase shift is performed if no conflict arises. If the stage SSC requests a phase shift, only the second flip-flop of the corresponding shift register is set. Therefore, the required phase shift is performed after two clock cycles if no conflict occurs. Consequently, if a phase shift is requested from both stages Frac-N and from SSC at the same time, the different fixed number of clock cycles will automatically remove the conflict and spread the two requested phase shifts over two consecutive clock cycles. However, if the spread spectrum stage SSC requests a phase shift one clock cycle later then the Frac-N stage, then a conflict can occur at the output of the shift register. In this situation, no phase shift will be performed. In the context of the present embodiment, the two opposite phase shift requests create a conflict if they occur at the same time at the output of the two shift registers rather than at the input. This is due to the different fixed numbers of clock cycles the requests need to be shifted through the two registers. If the two requests in opposite directions occur at the same time at the input, two phase shifts can be performed without conflict. So, in the context of the invention, the simultaneity of two conflicting requests can relate to two requests, which are issued from the respective stages in consecutive clock cycles rather then the same. However, in a different embodiment having another architecture, the conflict may arise if the requests are issued at the same clock cycle. This conflict may then be resolved in the same manner as illustrated with respect to the present embodiment of the invention by not performing any phase shift. FIGS. 6 to 8 illustrate again three different situations for the embodiment shown in FIGS. 4, 5A and 5B.

FIG. 6 shows the situation when the spread spectrum logic stage and the fractional N stage Frac-N request a phase shift at the same time and in the same direction. This results in the output D13 of the logic stage LOGIC X requesting a phase change from the interpolator INT at consecutive clock cycles. FIG. 7 shows a situation where both the spread spectrum logic stage SSC and the fractional N stage Frac-N both send a phase shift request at the same time but in opposite directions. Again, this results in the logic stage LOGIC X requesting a phase change from the interpolator INT at consecutive clock cycles. So, the circuit dissolves the conflict by providing two consecutive phase shifts as indicated by the two pulses of D13. FIG. 8 shows the case where the spread spectrum logic stage SSC and the fractional N stage Frac-N send phase change requests on consecutive clock cycles. In this case, the phase shift gets cancelled out and the output D13 of the logic stage LOGIC X remains at logic 0.

Those skilled in the art will appreciate that many other embodiments and variations are also possible within the scope of the claimed invention. Embodiments having different combinations of one or more of the features or steps described in the context of example embodiments having all or just some of such features or steps are also intended to be covered hereby.

What is claimed is:

1. A spread spectrum, fractional-N, phase locked loop circuit comprising a chain of:
  a reference clock divider;
  a phase-frequency detector;
  a charge pump with loop filter;
  a voltage controlled oscillator that provides multiple phase outputs, and
  a feedback loop from the multiple phase outputs of the voltage controlled oscillator to a feedback input of the phase-frequency detector;
  said feedback loop including a phase selector, a feedback divider and a control block with an output controlling said phase selector to select a particular phase as an input to the feedback divider;
  wherein said control block includes:
  spread spectrum logic circuitry receiving an input from the output of the phase selector and providing a directional control output signal and a phase step control signal;

fractional logic circuitry receiving an input from the output of the phase selector and providing a phase step control signal, and a logic interface circuit that combines the directional control output signal from the spread spectrum logic circuitry, the phase step control signal from the spread spectrum logic circuitry and the phase step control signal from the fractional logic circuitry, so that, when both of the spread spectrum logic circuitry and the fractional logic circuitry request a phase step in the same feedback clock period in the same direction, a single phase step control signal is passed to the phase selector and a further phase step control signal is passed to the phase selector in a subsequent clock period; and so that, when the spread spectrum logic circuitry and the fractional logic circuitry request a phase step in the same feedback clock period in opposite directions, no phase step control signal is passed to the phase selector.

2. The circuit of claim 1, wherein the phase selector includes a phase interpolator.

3. The circuit of claim 2, wherein the logic interface circuit includes two shift registers clocked by the output of the phase selector; a first one of said shift registers having inputs receiving the directional control output signal from the spread spectrum logic circuitry, the phase step control signal from the spread spectrum logic circuitry and the phase step control signal from the fractional logic circuitry; a second one of said shift registers having inputs receiving the directional control output signal from the spread spectrum logic circuitry and the phase step control signal from the spread spectrum logic circuitry; and outputs of said shift registers being combined with an OR gate to provide a phase step control signal to the phase selector.

4. The circuit of claim 3, wherein the second shift register provides a direction control signal to the phase selector.

5. The circuit of claim 1, wherein the logic interface circuit includes two shift registers clocked by the output of the phase selector; a first one of said shift registers having inputs receiving the directional control output signal from the spread spectrum logic circuitry, the phase step control signal from the spread spectrum logic circuitry and the phase step control signal from the fractional logic circuitry; a second one of said shift registers having inputs receiving the directional control output signal from the spread spectrum logic circuitry and the phase step control signal from the spread spectrum logic circuitry; and outputs of said shift registers being combined with an OR gate to provide a phase step control signal to the phase selector.

6. The circuit of claim 5, wherein the second shift register provides a direction control signal to the phase selector.

* * * * *